(12) United States Patent
Rebelo et al.

(10) Patent No.: US 7,667,321 B2
(45) Date of Patent: Feb. 23, 2010

(54) WIRE BONDING METHOD AND RELATED DEVICE FOR HIGH-FREQUENCY APPLICATIONS

(75) Inventors: Ashley Rebelo, Allentown, PA (US); Todd Snider, Gilbert, AZ (US)

(73) Assignee: Agere Systems Inc., Allentown, PA (US)

( * ) Notice: Subject to any disclaimer, the term of this patent is extended or adjusted under 35 U.S.C. 154(b) by 528 days.

(21) Appl. No.: 11/717,227

(22) Filed: Mar. 12, 2007

(65) Prior Publication Data

US 2008/0227284 A1      Sep. 18, 2008

(51) Int. Cl.
*H01L 21/44* (2006.01)
(52) U.S. Cl. .................. 257/728; 257/E23.08; 438/617
(58) Field of Classification Search .......... 257/678, 257/728, E23.08, E21.476; 438/617
See application file for complete search history.

(56) References Cited

U.S. PATENT DOCUMENTS

| | | |
|---|---|---|
| 6,031,216 A | 2/2000 | Singh et al. |
| 7,030,490 B2 * | 4/2006 | Lee .......................... 257/728 |
| 2005/0245062 A1 | 11/2005 | Kingsbury et al. |
| 2005/0275089 A1 | 12/2005 | Joshi et al. |
| 2006/0180916 A1 | 8/2006 | Wyland |
| 2006/0192300 A1 | 8/2006 | Appel et al. |

FOREIGN PATENT DOCUMENTS

| | | |
|---|---|---|
| WO | WO0120669(A2) | 3/2001 |
| WO | WO0120669(A3) | 3/2001 |
| WO | WO2006090196(A1) | 8/2006 |

OTHER PUBLICATIONS

Dennis Yee et al., "A 2-GHz Low-Power Single-Chip CMOS Receiver for WCDMA Applications", Dec. 31, 2000.

* cited by examiner

*Primary Examiner*—Roy K Potter
(74) *Attorney, Agent, or Firm*—Ryan, Mason & Lewis, LLP

(57) ABSTRACT

A wire bond circuit device has a circuit die in which substantially all of the input/output (I/O) pads are disposed along the outermost row of pads. A substrate onto which the die is disposed has wedges that are similarly arranged in rows, with the wedges used to carry I/O placed closest to the circuit die. As a result, lowest-tiered bond wire is used to connect the I/O-related pads to their respective wedges.

29 Claims, 8 Drawing Sheets

WIRE BONDING METHOD AND RELATED DEVICE FOR HIGH-FREQUENCY APPLICATIONS

FIELD OF THE INVENTION

The present invention relates generally to the packaging of semiconductor dies. More particularly, the present invention discloses a method, and related semiconductor package, that permits the use of wire bonding in high-frequency applications.

BACKGROUND OF THE INVENTION

Wire bonding is a well-known die packaging method that electrically connects a semiconductor die to the finger leads of a packaging substrate. As shown in FIGS. 1 and 2, a packaging substrate 10 is used to package a semiconductor die 20. The semiconductor die 20 rests face up upon the packaging substrate 10, and comprises a plurality of pads 22. The packaging substrate 10 includes a plurality of lead fingers or traces 12, which surround the die 20, and which terminate in what are generally called bond fingers or wedges 14. The wedges 14, via the traces 12, electrically connect to a plurality of pins, contacts, solder balls or the like (not shown) on the external surface of the packaging substrate 10 to provide electrical contact with external circuitry. Electrically connecting the pads 22 with the wedges 14 are a plurality of bond wires 30. Typically, there is a one-to-one correspondence between wedges 14 and pads 22, but this is certainly not a requirement, particularly in the case where the wedges 14 form a ground or power ring, or similar structure, around the die 20.

A wire bonding apparatus extrudes the bond wires 30, creating a ball bond 32 upon the pads 22, and a stitch bond 34 upon the wedges 14. The wire bonding apparatus can control both the loop height h of the bond wire 30, which is the height the bond wire 30 rises above the top surface of the substrate 10, and can also control the flat length f of the bond wire 30, which is the distance from the ball bond 32 to a bend 33 in the bond wire 30 at which the bond wire 30 begins to descend towards the substrate 10 for the wedge 14.

To provide sufficient tolerances for the wire bonding apparatus, the pads 22 should have certain minimum dimensions, which may be as little as 35 μm. Typical pad 22 sizes, however, range from 52 μm to 65 μm, and the pads 22 are generally square, although rectangular die pads are also possible. Typical pitch widths are 70 μm, with trends towards smaller pitch widths, such as 65 μm and lower as equipment and processes develop. The semiconductor die 20 includes circuitry 28 that electrically connects to the pads 22. Some applications will require that the circuitry 28 utilize a large number of pads 22 for input/output (I/O), power connections and the like. If, as shown in FIG. 1, a single row, or tier, of pads 22 is used around the circumference of the die 20, the minimum pitch widths of the pads 22 will force a total minimum size upon the die 20 to accommodate the pads 22. Semiconductor real estate on the die 20, however, is relatively expensive. Manufacturing costs of semiconductor devices can be significantly reduced if a bare minimum of semiconductor area is used for the die 20. Hence, as shown in FIG. 3, multi-rowed pads are now quite common.

As shown in FIG. 3, a semiconductor die 40 may include a plurality of pads 42 that are arranged in an outer row 44 and an inner row 46. Wedges 52 surround the die 40, and electrically connect to the pads 42 by way of bond wires 60. The wedges 52 may similarly be arranged in a series of concentric rings or rows, having an inner row 54 and an outer row 56 of wedges 52. By providing inner 46 and outer 44 rows of pads 42, a significant savings in semiconductor real estate on the die 40 is made possible. To avoid shorting between the various bond wires 60, the wedges 52 and pads 42 are arranged so that the outer row pads 44 are wire bonded to the inner row wedges 54, and the inner row pads 46 are wire bonded to the outer row wedges 56. As shown in FIG. 4, the loop height of the bond wire 60 that connects the outer row wedges 56 to the inner row pads 46 is relatively high; because of this height, such bond wires 60 are termed upper tier wires 66. Similarly, the bonding wire 60 that connects the outer row pads 44 to the inner row wedges 54 has a relatively low loop height, and is thus called a lower tier bonding wire 64. Because the row position of a pad 42 will in large part determine the loop height of its corresponding bond wire 60, pads 42 may be spoken of as lower tier pads 44 (i.e., those that are outermost with respect to the circuitry 48), and upper tier pads 46 (i.e., those that lie closest in to the circuitry 48). A similar terminology may be employed with the wedges 52 for the same reason. Lower tier pads 44 and wedges 54 are generally used for power and ground connections, while the upper tier pads 46 and wedges 56 are used for I/O connections. This electrical arrangement is not a physical requirement, but rather is considered an electrical "best practice," as short power-related bond wires 60 tend to improve the electrical performance of the entire package.

Wire bonding is a well-developed technology, and is considerably cheaper to use than the so-called flip-chip packaging method, in which the die is bonded face-down onto the substrate, with the pads on the die electrically contacting the substrate wedges without any intervening wires. For example, what may cost three to four dollars to package using wire bonding can cost upwards of ten to fifteen dollars using flip-chip. Flip-chip, however, is preferred in high-frequency applications, because of crosstalk that can develop between wire bonds. Indeed, flip-chip packaging is the preferred technology for signals in the 2 GHz or above range. As such, high-frequency devices tend to be relatively expensive. It would therefore be desirable to find a method, and related packaging system, that enables the use of wire bonding in high-frequency applications, particularly in applications involving signals of 2 GHz or greater.

SUMMARY OF THE INVENTION

In one aspect, a method for routing high-frequency signals between a circuit die and a packaging substrate is provided. The circuit die includes N+M pads arranged in a plurality of rows, and which are used to electrically connect the circuit die to the packaging substrate. The circuit die uses a total of N of the pads for high-frequency input/output (I/O), and M of the pads for other circuit functions, such as ground, power or the like. The pads and corresponding substrate wedges are arranged so that no more than X of the M pads used for other circuit functions are electrically connected to corresponding substrate wedges through bond wires that are substantially shorter than the Y shortest bond wires used to electrically connect the N high-frequency I/O pads to corresponding substrate wedges. X is no greater than 10% of N+M, and in certain embodiments X is zero. Y is at least 50% of N, and in certain embodiments Y equals N. In various embodiments, the N high-frequency I/O pads are electrically connected to their corresponding substrate wedges through lowest-tiered bond wires. In particular embodiments, the N high-frequency I/O pads are disposed along an outer-most circumference of the plurality of tiers, and no more than X wedges that are connected to the circuit die for other circuit functions are disposed closer to the circuit die than those wedges electrically connected to the Y high-frequency I/O pads having the shortest length bond wire.

In another aspect, an electronic device is provided. A packaging substrate has a plurality of wedges electrically connected to external conductors of the packaging substrate, and a circuit die is carried by the packaging substrate. The circuit die has N+M pads arranged in a plurality of tiers, with a total of N of the pads being used for high-frequency input/output (I/O) and M of the pads for other purposes. Bond wires electrically connect the pads to the wedges. No more than X of the M pads used for other purposes are electrically connected to corresponding wedges through bond wires that are substantially shorter than the Y shortest bond wires used to electrically connect the Y of the N high-frequency I/O pads to corresponding substrate wedges. X is no greater than 10% of N+M, and in certain embodiments X is zero. Similarly, Y is at least 50% of N, and in certain embodiments Y equals N. In specific embodiments, the bond wires connecting the N high-frequency I/O pads to the corresponding substrate wedges are lowest-tiered bond wires. In a particular embodiment, the N high-frequency I/O pads are disposed along an outer-most circumference of the plurality of tiers, and no more than X substrate wedges electrically connected to any of the M pads for other purposes are disposed substantially closer to the circuit die than any of the substrate wedges electrically connected to the N high-frequency I/O pads.

DETAILED DESCRIPTION

In the following, the term "high-frequency" is intended to indicate frequencies in excess of 2 GHz, and up to 12 GHz, or possibly beyond. A possibly advantageous frequency range is between 4 and 8 GHz, and even more preferably between 4 and 6 GHz.

Figure 1:
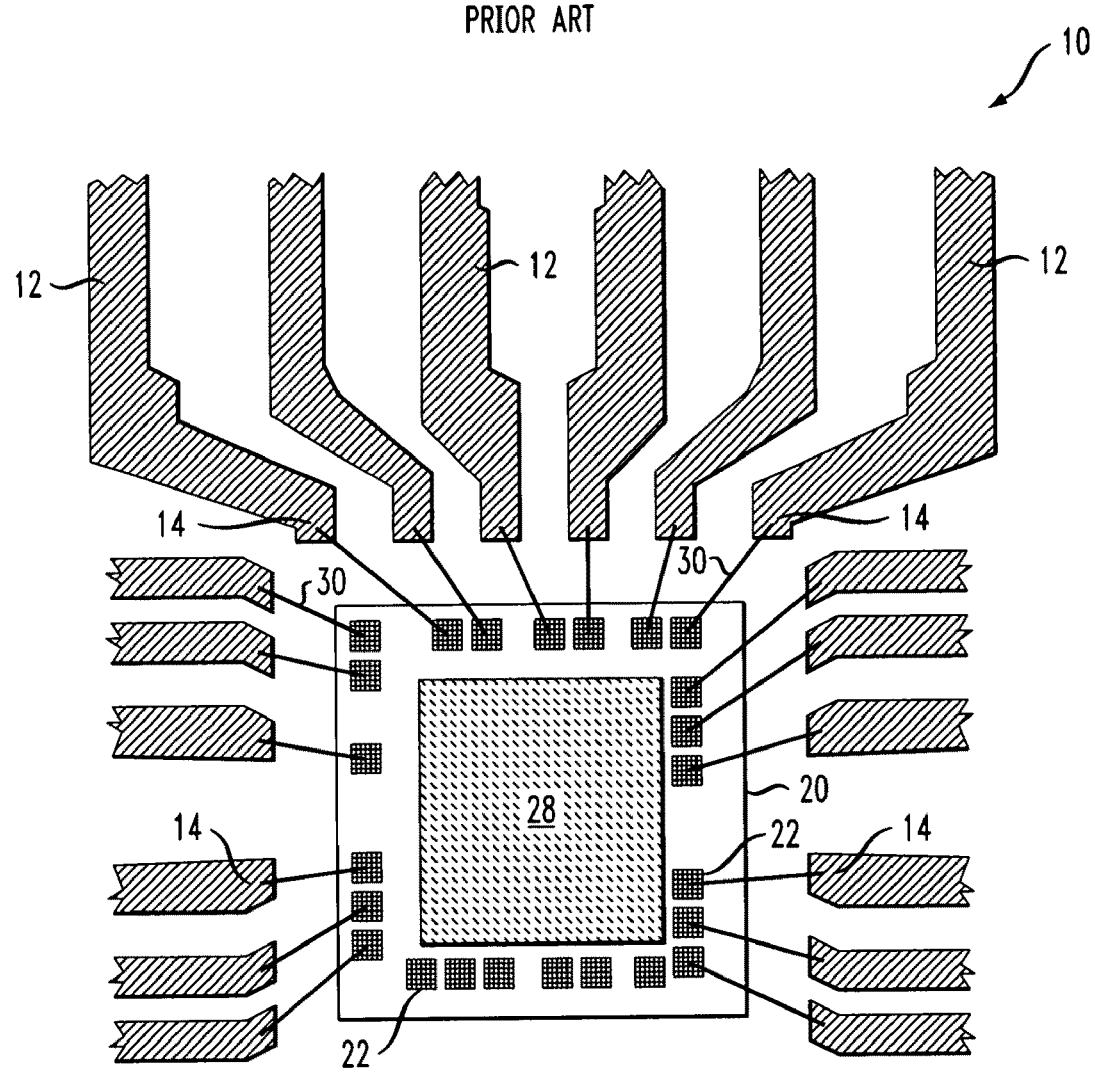
FIG. 1 is a top view of a single-tiered semiconductor die within a packaging substrate.
Figure 2:
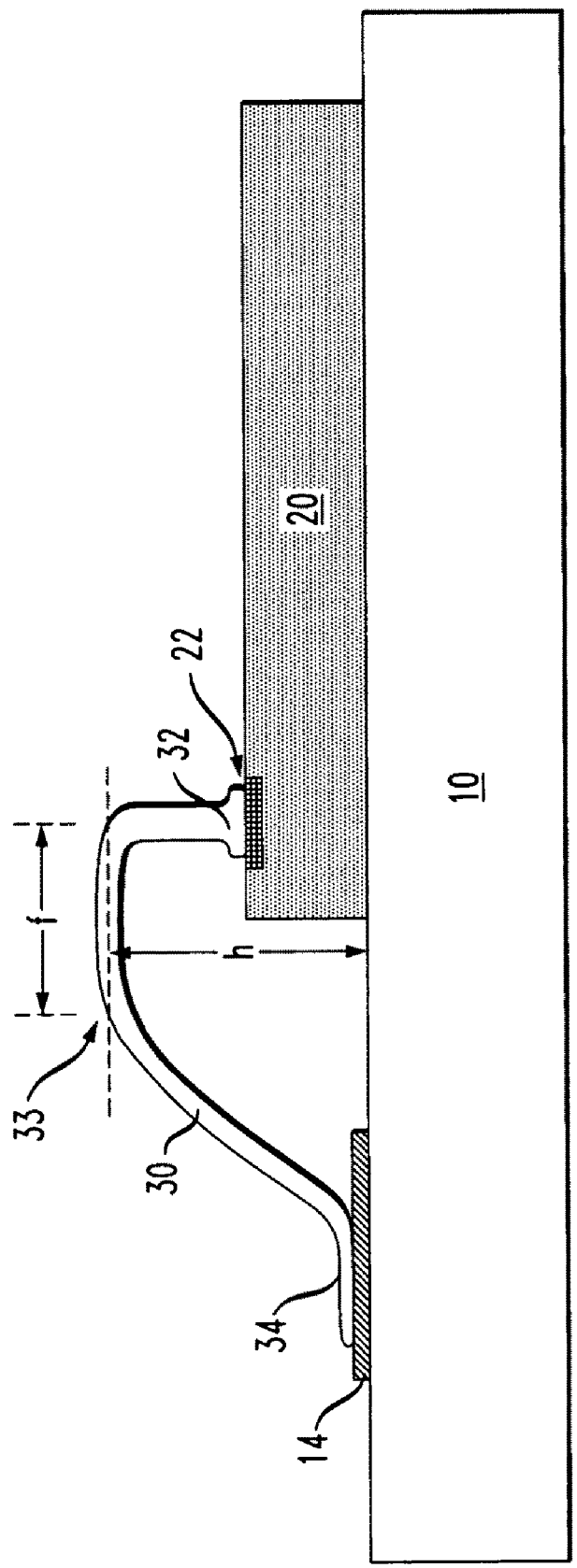
FIG. 2 is a side view of the layout depicted in FIG. 1.
Figure 3:
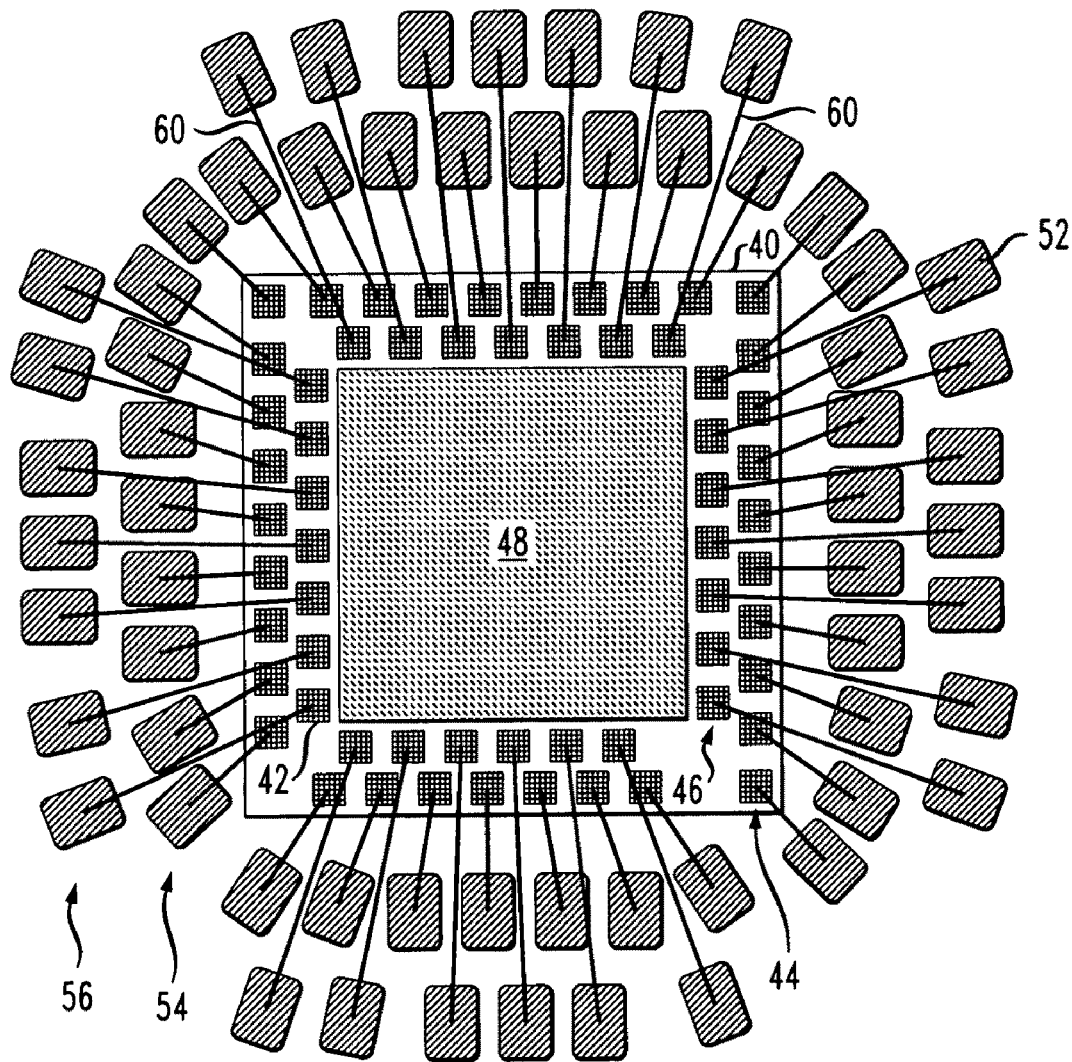
FIG. 3 is a top view of a multi-tiered semiconductor die within a packaging substrate.
Figure 4:
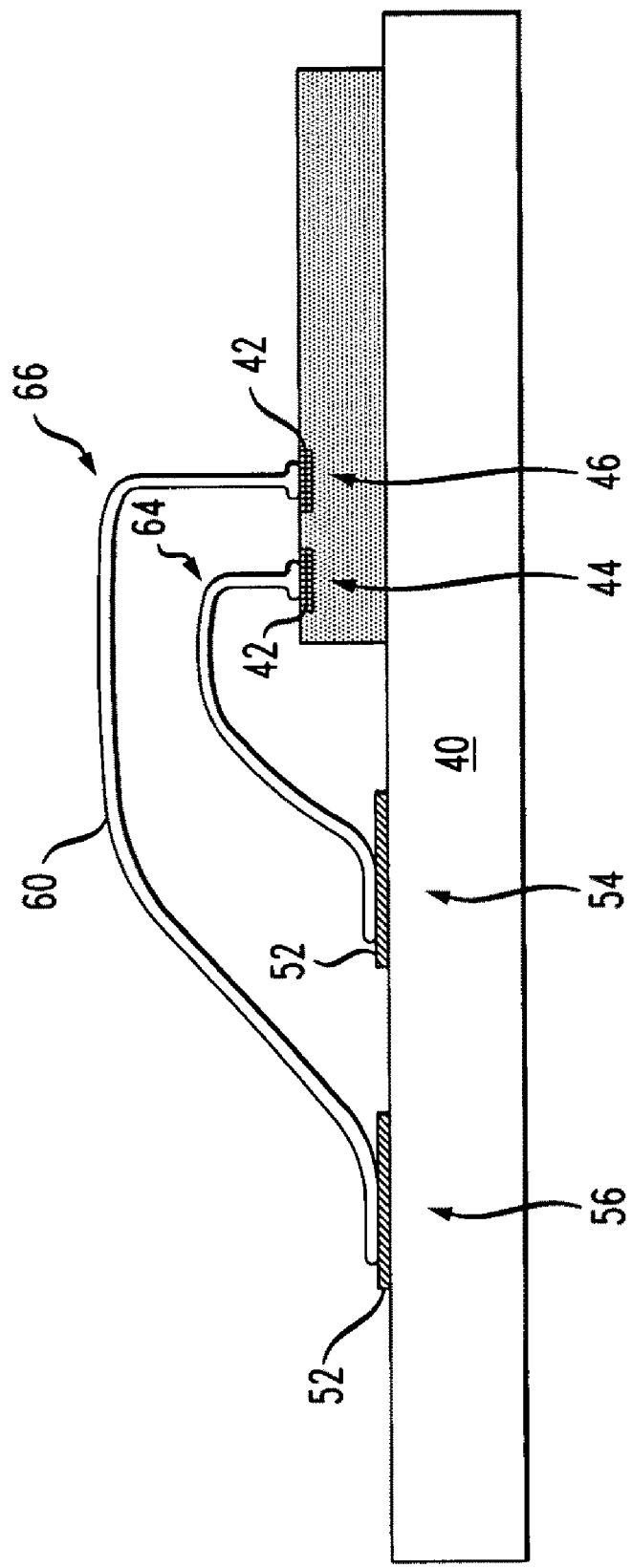
FIG. 4 is a side view of the layout depicted in FIG. 3.
Figure 5:
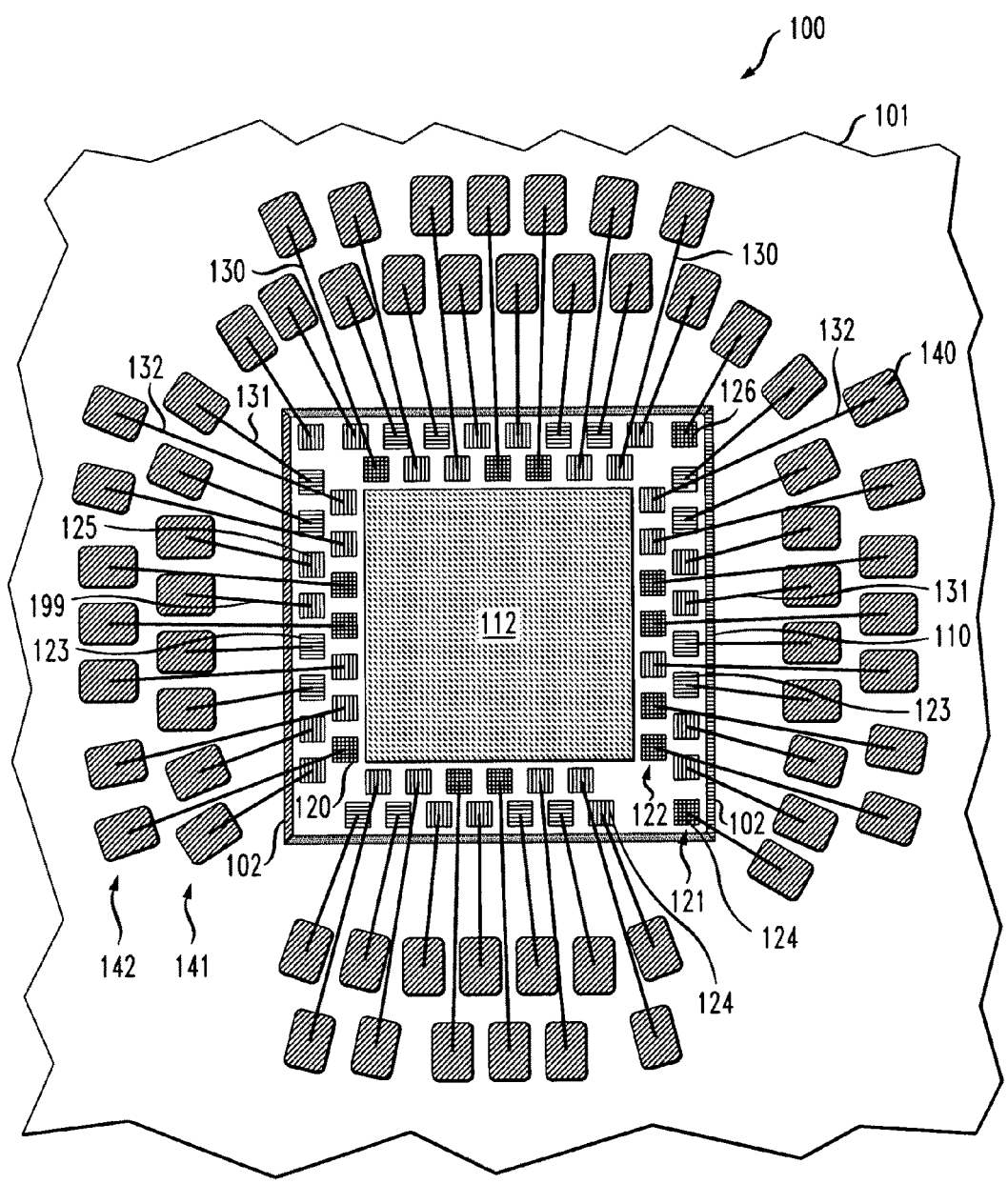
FIG. 5 is a partial top view of a first embodiment multi-tiered circuit die within a packaging substrate.

A simplified, partial view of a first embodiment electronic device 100 employing an aspect of the invention method is depicted in FIG. 5. The device 100, which may be, for example, a ball grid array (BGA) component, includes a substrate 101 that carries a circuit die 110. The circuit die 110, which may be, for example, a semiconductor substrate, is bonded face up onto the substrate 101. The substrate 101 is typically a laminate formed from conductive and non-conductive sheets, which electrically connects to external contacts (not shown), such as a BGA or the like. The external contacts are used to connect the electrical device 100 to other, external electrical devices, as known. Typically, a conductive adhesive is used to bond the circuit die 110 to the substrate 101, which forms a fillet 102 around the circuit die 110.

Disposed across the top face of the circuit die 110 are numerous electrical circuit elements, which may be formed by standard semiconductor manufacturing techniques as known in the art. These circuit elements include a high-frequency circuit 112 in electrical communications with a plurality of pads 120.

The pads 120 are disposed around the circuit 112, forming a plurality of concentric rows. An innermost row 122 lies closest to the circuit 112, while an outermost row 121 lies closest to the edge of the circuit die 110. Although only two rows 121, 122 are shown for the sake of convenience, it should be understood that the circuit die 110 could employ more than just two rows of pads; indeed, four rows of pads are not uncommon. The outermost pads 121 are generally spaced about 100 µm from the edge of the circuit die 110. The pads 120 are used to provide electrical connection points between the high-frequency circuit 112 and the substrate 101, and may even be disposed over the high-frequency circuit 112. In the following discussion, it should be understood that some pads 120 may be formed on the circuit die 110 for purposes other than electrically connecting the high-frequency circuit 112 to the substrate 101, and by extension to circuitry external to the device 100. Such unconnected pads 120 may be used, for example, for quality control purposes, production purposes, testing or the like. However, pads 120 that remain electrically unconnected to the substrate 101 when the die 110 is packaged are of little interest for purposes. of the instant invention, and so generally will not be shown. Additionally, so called "jumper pads" are not considered in the following, which are pads that are electrically connected to each other to relocate the position of a pad. Of interest to the instant invention are those pads 120 that are electrically and physically connected to wedges 140 on the substrate 101 via bond wires 130, and which thereby electrically connect the high-frequency circuit 112 to the substrate 101, and hence to electronics external to the device 100 by way of the external contacts.

The pads 120 may be broadly broken into two categories: input/output (I/O) pads 123, represented by horizontal hatching in FIG. 5, and pads 124 that support other circuit 112 functions that are not related to high-frequency I/O. Individually, the I/O pads 123 may be receive pads (in which they provide high-frequency signals received from the substrate 101 to the circuit 112), transmit pads (in which they transmit high-frequency signals from the circuit 112 to the substrate 101), or pads that support both the input and output (receive and transmit) of high-frequency signals. The pads 124 used for other circuit 112 purposes may be further sub-categorized: power-related pads 125 and others 126. The power-related pads 125 provide ground and power connections to the circuit 112. The other pads 126 may be used to provide, for example, digital I/O (used, for example, to program components within the high-frequency circuit 112), and voltage reference signals to the circuit 112.

Disposed upon the substrate 101 and surrounding the circuit die 110 are a plurality of wedges 140. The wedges 140 may also be arranged in rows, with an innermost row 141 of wedges 140 being disposed closest to the circuit die 110, and an outermost row 142 disposed farthest from the circuit die 110. To avoid shorting between the wedges 140 and the fillet 102, the wedges 140 are generally spaced at least 400 µm from the edge of the circuit die 110. By way of example, typical distances for the wedges 140 may place the closest row 141 of wedges 140 about 900 µm from the circuit die 110, the second row 142 of wedges 140 about 1800 µm from the circuit die 110, and an outer row (not shown) of wedges 140 about 3800 µm from the circuit die 110. These distances, however, can vary based on pad 120 positions relative to the wedge 140 pattern. Usually, the pads 120 at the corners of the die 110 have slightly longer distances to their respective wedges 140 than those pads 120 at the center of the die 110. As indicated, there may be more than just two rows 141, 142 of wedges 140 disposed on the substrate 101 around the circuit die 110; two rows 141, 142 are shown here merely for the sake of convenience. The wedges 140 have finger leads or traces, not shown in FIG. 5, that electrically connect to the external electrical contacts (also not shown) of the electronic device 100, as known in the art. These external contacts may be, for example, pins, as used in dual in-line packaging (DIP), low profile packaging and the like; solder balls, as used in ball grid array (BGA) packaging, or any other suitable electrical contact used to connect the electronic device 100 with other electronic circuits. For purposes of the following, it is assumed that all wedges are electrically connected to one or more of external electrical contacts; however, it will be appreciated that this is not a requirement of the instant invention.

A plurality of bond wires 130 are used to directly electrically connect the wedges 140 to the pads 120. The wedges 140 are thus physically and electrically coupled to their corresponding pads 120. The physical connection is interesting insofar as it provides the direct electrical connection. Although not required, as shown in FIG. 5 there is typically a one-to-one correspondence between wedges 140 and pads 120, so that a single pad 120 is electrically connected to a single corresponding wedge 140 by way of a single bond wire 130. However, it is not uncommon to find instances in which one wedge 140 will share two or more bond wires 130; generally these bonds wires 130 provide power or ground connections, and are used to minimize the amount of valuable substrate 101 real estate used to surround high-frequency I/O wedges 140. To avoid potential shorting between bond wires 130, outermost row 121 pads 120 are typically connected to innermost row 141 wedges 140, using relatively low loop height bond wires 130, which are thus termed low tier bond wires 131. Bond wires 130 with greater loop heights are used to connect the innermost row 122 pads 120 to outermost row 142 wedges 140, and are called upper tier bond wires 132. Given that there are but two rows of wedges 141, 142 and pads 121, 122 depicted in FIG. 5, there are similarly only two tiers 131, 132 of bond wires 130: the lowest tiered bond wires 131, and the highest tiered bond wires 132. However, it will be appreciated that more than just two tiers of bond wires are possible, to accommodate greater numbers of rows in pads, wedges or both.

Routing of electrical connections between the high-frequency circuit 112 and the pads 120 is relatively easy in terms of the row depth of the pads 120, though the same cannot be said for changing the angular position of the pads 120 with respect to the center of the high-frequency circuit 112. That is, for the routing of traces that connect a particular pad 120 to the high-frequency circuit 112, in the same general region it is typically neither more nor less difficult to position that pad 120 within the outermost row 121 or the innermost row 122. Similarly, the positions of wedges 140 may be relatively easily changed between inner row 141 and outer row 142 positions, though their angular positions with respect to the center of the high-frequency circuit 112 are generally determined by the positions of their corresponding pads 120. The instant invention takes advantage of this fact to position all, substantially all, or a majority, such as at least 50%, of the high-frequency I/O pads 123 into the outermost row 121, and correspondingly position the associated wedges 140 into the innermost row position 141 so that the high-frequency I/O pads 123 are positioned as closely as possible to their corresponding wedges 140 and electrically connected through lowest tier bond wire 131. These lowest-tiered bond wires 131 thus carry high-frequency I/O signals between the pads 123 and their corresponding wedges 140. Ideally, at least 95% of the wedges 140 that carry high-frequency I/O signals should be between 400 μm and 2 mm from the circuit die 110, and at least 95% of the bond wires 130 that carry high-frequency I/O signals should be less than 2.5 mm in length.

Without wishing to be bound by theory, it is believed that minimizing the length of the bond wire 130 used to connect a pad 120 to a wedge 140 works to significantly reduce the amount of crosstalk between bond wires 130. As crosstalk is primarily a concern in I/O signals, it is desirable to minimize the length of the bond wires 130 used to carry such I/O signals. Minimization of the lengths of the I/O-related bond wires 130 is accomplished by repositioning wedges 140 and pads 120 so that the high-frequency I/O pads 123 are as close to their corresponding wedges 140 as can be had, with all other design constraints taken into consideration; such constraints may include, for example, the amount of area on the substrate 101 a certain distance from the die 110 that is available to accommodate the wedges 140. As indicated, one way to minimize the lengths of the I/O-related bond wires 130 is to position the high-frequency I/O pads 123 into the outermost row 121, and position the corresponding wedges 140 into the innermost row 141. As a result, the high-frequency I/O pads 123 are positioned as closely as possible to their respective wedges 140. Moreover, the lowest tiered bond wires 131 are used to connect the high-frequency I/O pads 123 to the corresponding wedges 140. The high-frequency I/O-related bond wire 130 may thus have lengths from about 1 mm to about 2 mm.

Although there may be individual exceptions forced by design requirements, as a group the I/O pads 123 may employ bond wires 130 that are collectively shorter on average than, or at least equal to, the bond wires 130 employed by any other category or sub-category of pads 120. There may be exceptions in which one or more bond wires 130 carrying high-frequency I/O signals are substantially longer than other bond wires 130 that are not related to high-frequency I/O. Or, there may be a few particularly short bond wires 130 that are not related to high-frequency I/O, such as ground or power, that are shorter than all of the bond wires 130 related to high-frequency I/O. Generally, however, at least about 50% of the high-frequency I/O signals will be carried by the shortest-possible bond wires 130, by suitable positioning of the pads 120 and wedges 140, and generally less than about 10% of all pads 120 will be pads 124 for other circuit functions that are connected to corresponding wedges with bond wires 130 that are substantially shorter than those shortest 50% used to carry the high-frequency I/O. Phrased another way, for preferred embodiments, of all pads 120 fewer than about 10% will be pads 124 that are used for circuit functions other than high-frequency I/O that have bond wires 130 that are substantially shorter than about 50% or more of the shortest bond wires 130 used by the I/O pads 123. In certain embodiments, all of those pads 124 having bond wires 130 substantially shorter than the shortest bond wires 130 used by the I/O pads 123 are power-related pads 125, and in particular ground pads 125, which are useful to reduce crosstalk between high-frequency I/O signals. More preferably still, at least about 75% of the high-frequency I/O signals are carried by the shortest-possible bond wires 130. Even more preferably, at least about 90% of the high-frequency I/O signals are carried by the shortest-possible bond wires 130. It certain embodiments, no more than 5% of the pads 124 that are used for circuit functions other than high-frequency I/O have bond wires 130 that are substantially shorter than the shortest bond wires 130 used by the I/O pads 123. More preferably, no more than 1% of the pads 124 that are used for circuit functions other than high-frequency I/O have bond wires 130 that are substantially shorter than the shortest bond wires 130 used by the I/O pads 123.

Simply by way of example, suppose that the circuit die 110 has four hundred pads 120, of which sixty are high-frequency I/O pads 123. Sixty bond wires 130 connect the high-frequency I/O pads 123 to their respective wedges 140. At least 50%, or 30, of these sixty bond wires 130 are within the substantially shortest of all bond wires 130 that electrically connect the circuit die 110 to the substrate 101. Ideally, all sixty bond wires 130 connected to the high-frequency I/O are among the substantially shortest of all bond wires 130. However, there may be exceptions. For example, there may be a few particularly short bond wires 130 that ideally carry ground or power, and which are substantially shorter than some or all of the high-frequency related bond wires 130. In this example, since 10 of all pads 120 is 40, only about 40 pads 124 for other circuit functions will have bond wires 130 that are substantially shorter than the sixty bond wires 130 that connect to the high-frequency I/O pads 123. Similarly, of the sixty bond wires 130 that carry high-frequency I/O, at least 30 of these bond wires 130 should be within the substantially shortest of all the bond wires 130, excepting the 40 bond wires 130 just discussed.

By way of another example, a design may include a total of five hundred pads located in three rows, each pad having a respective bond wire. 150 of these pads may be in the outermost, or lowest tiered, row. The design may include eighty pads for high-frequency I/O. Forty of these high-frequency I/O pads may be positioned in the outermost row of pads, and forty may be positioned in the middle row of pads. The outermost row of pads may thus include an additional 110 pads that are used for other circuit functions, such as power or ground. There may therefore be 110 bond wires connected to pads used for other circuit functions that are substantially shorter than the forty bond wires connected to pads used for high-frequency I/O that are in the middle row. In this case, however, there are no bond wires connected to pads used for other circuit functions that are substantially shorter than the shortest 50% of the bond wires carrying high-frequency I/O signals, which are in the outer row of pads. In an alternative embodiment, at least about 95% percent, or about 76, of the pads carrying high-frequency I/O signals may be disposed in the outermost row of pads; preferably, at least 50% of the wedges that connect to these 76 high-frequency I/O pads are disposed within the innermost row of wedges, with the remainder in the next highest tiered row of wedges.

It will be understood that there may be variations in the lengths of bond wires 130 within the same tier 131, 132, but typically these variations are not substantial. For example, as shown in FIG. 5, a lowest tier 131 bond wire 199 connecting a power-related pad 125 to a corresponding wedge 140 may be slightly shorter than some, or even all, of the lowest tiered bond wires 131 that connect the high-frequency I/O pads 123 to their respective wedges 140. However, this bond wire 199 is no more than 50% shorter than any of the lowest tiered bond wires 131 carrying high-frequency I/O signals, and such variations in length may be considered insubstantial; that is, the other lowest tier bond wires 131 are not substantially longer than the bond wire 199. On the other hand, a substantial difference in length exists between bond wires 130 in different tiers 131, 132. For example, along generally the same radial direction from the center for the high-frequency circuit 112, the lower tier bond wires 131 are at least 50% shorter than the upper tier 132 bond wires 130. This substantial difference in length is due both to the greater extent across the substrate 101 that the upper tier bond wire 132 must cover, and from the greater loop height of the upper tier bond wire 132. In certain, specific embodiments, about a five hundred μm differential in length will exist between bond wires 130 in different tiers; hence, at least between bond wires 130 along generally the same radial with respect to the center of the high-frequency circuit 112, a five hundred μm difference in length may be considered substantial. More generally, though, a substantial difference in length between bond wires 130 may be considered to exist when there is a difference in the row ranking (i.e., tier height) of the pads 120, wedges 140 or both of the bond wires 130. Additionally, in certain preferred embodiments, at least 95% of the bond wires 130 coupled to the high-frequency I/O pads 123 have lengths that are no longer than 2.5 mm, as it is believed that lengths greater than this will not be able to adequately support the contemplated high-frequency signals.

Figure 6:
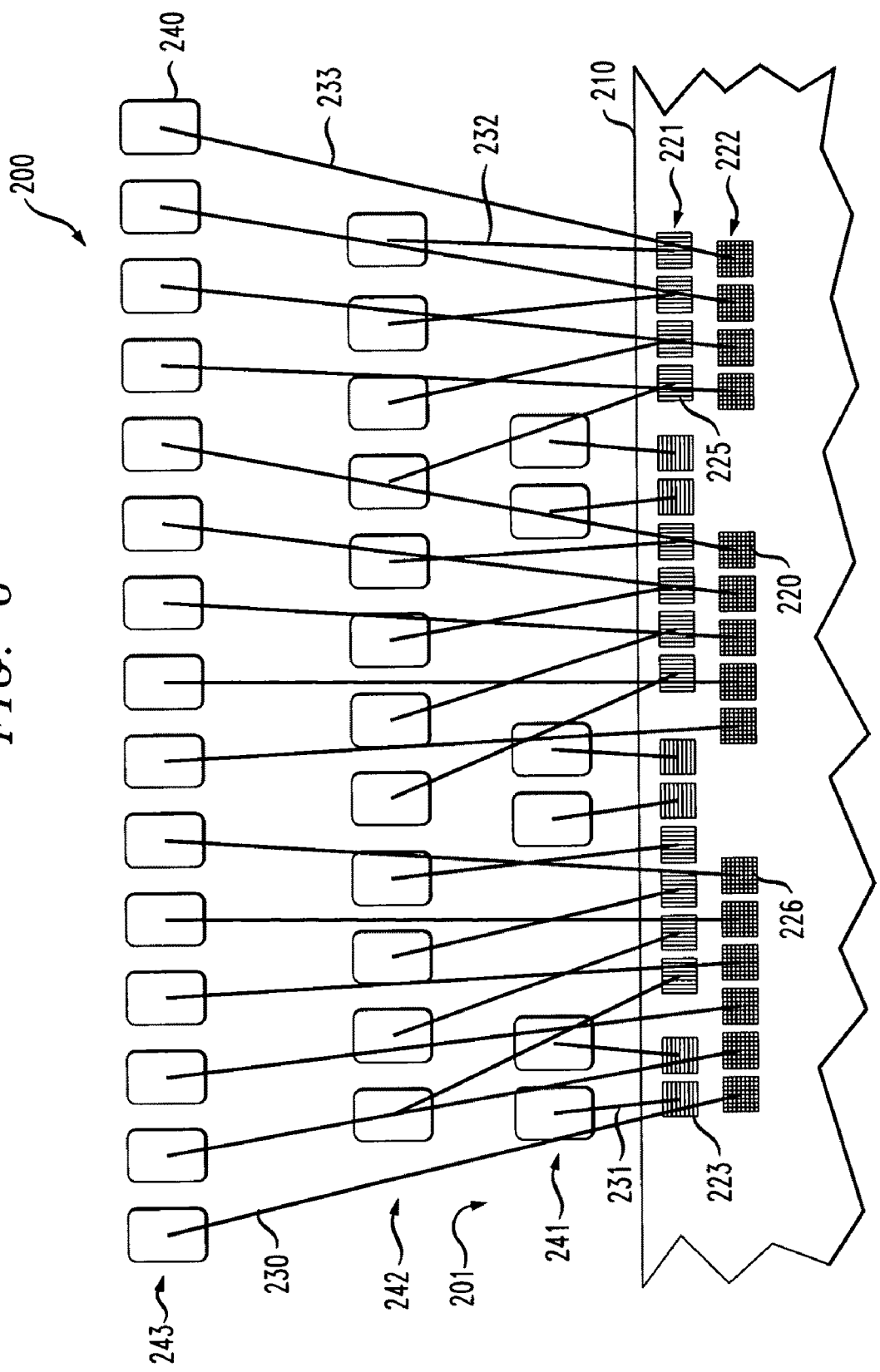
FIG. 6 is a partial top view of a second embodiment multi-tiered circuit die within a packaging substrate.
Figure 7:
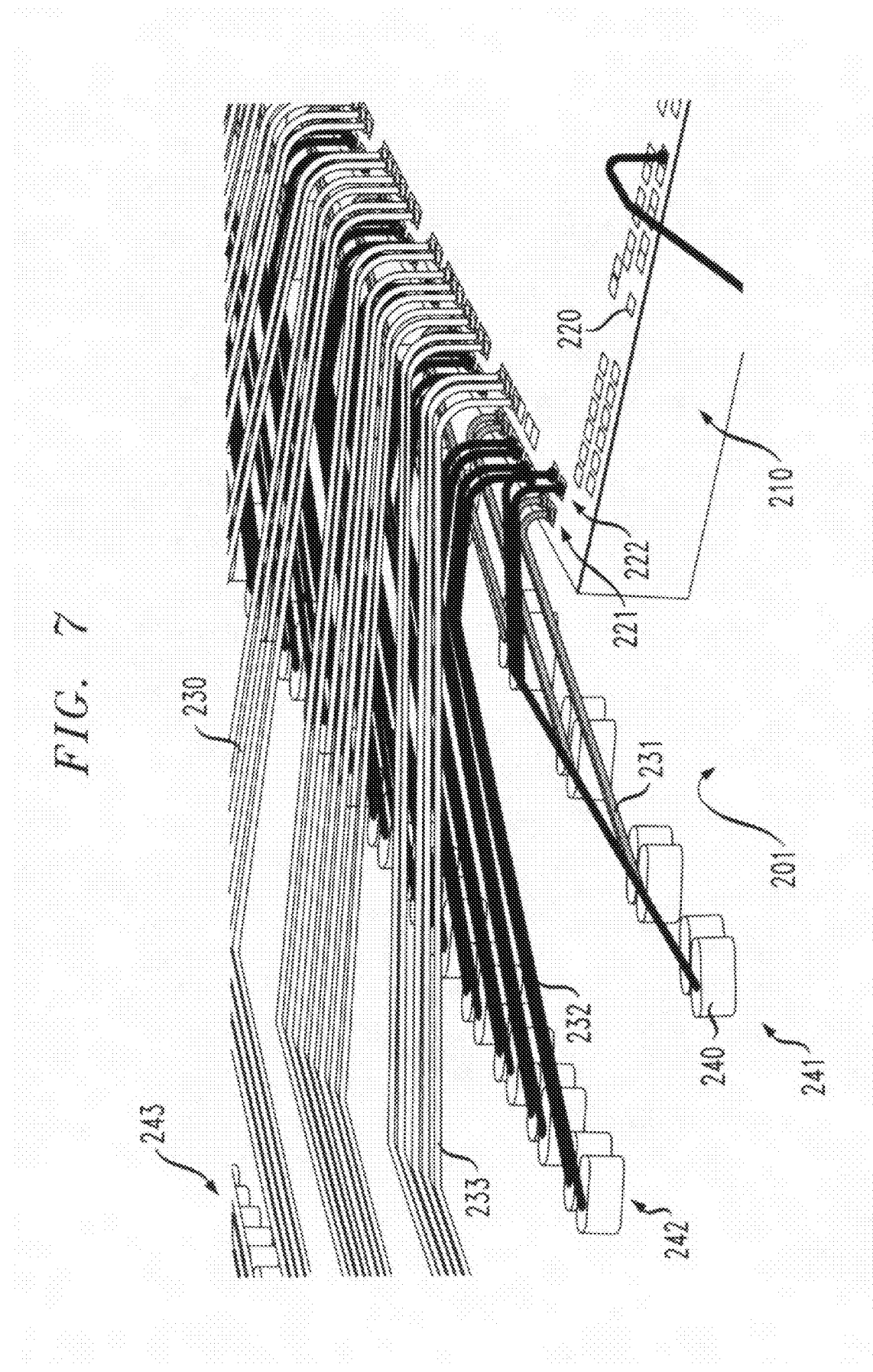
FIG. 7 is a perspective view of the embodiment depicted in FIG. 6.
Figure 8:
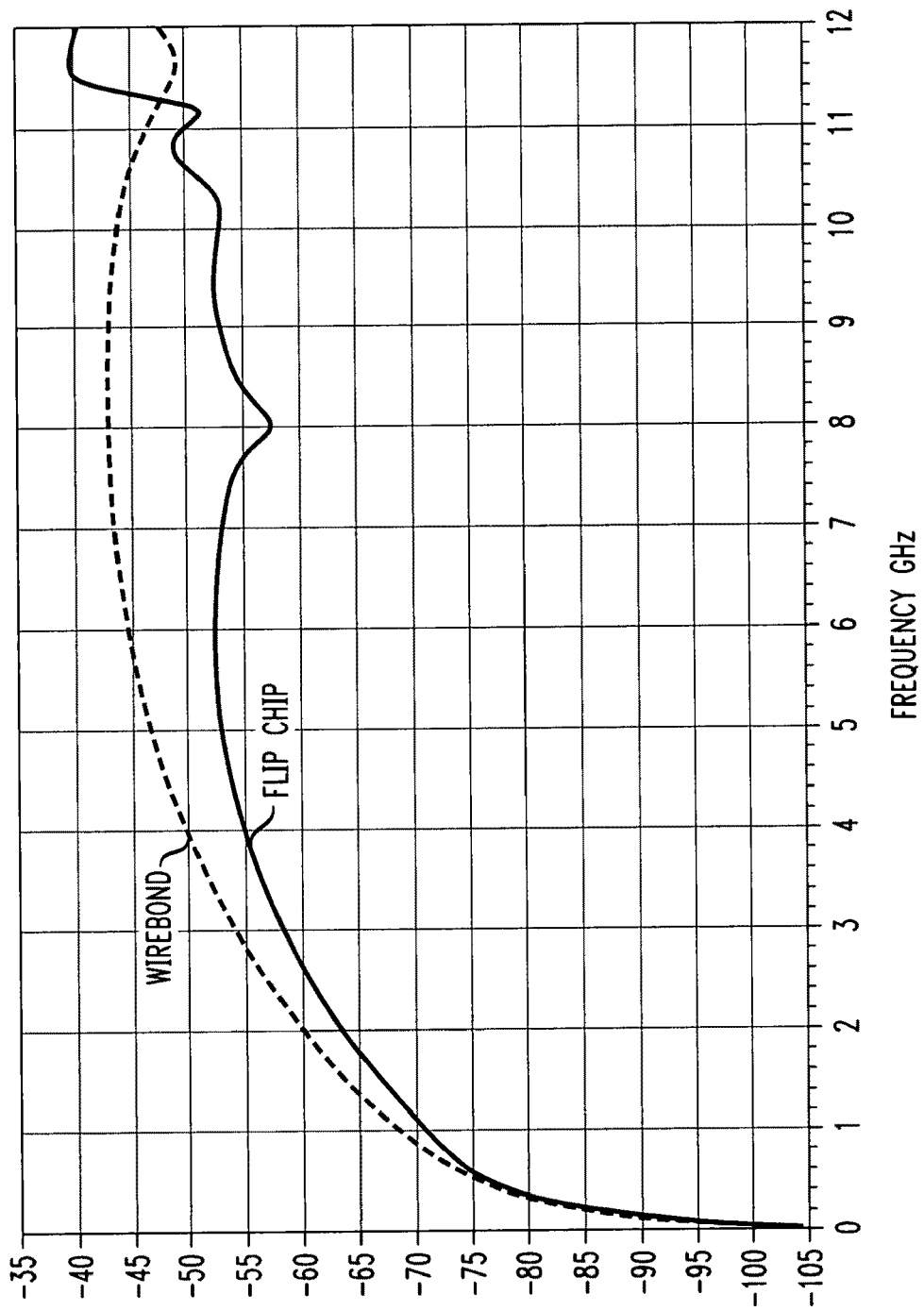
FIG. 8 is a graph showing cross-talk as a function of frequency.

It is not necessary that all pads of a certain row ranking be connected exclusively to wedges of another row ranking. On the contrary, it is possible for pads in one row to connect to wedges in different rows, as shown in FIGS. 6 and 7. FIG. 6 shows a simplified, partial top view of a circuit device 200 employing an embodiment method, while FIG. 7 provides a perspective view of the partial view shown in FIG. 6. A circuit die 210 includes a plurality of pads 220 arranged into an upper (or innermost) row 222, and a lower (or outermost) row 221, the "upper" and "lower" indicating the tier height of the respective bond wire 230 coupled to the pad 220. The pads 120 include I/O pads 223 for high-frequency I/O, power-related pads 225 and pads 226 for other circuit functions, such as providing digital I/O to program the high-frequency circuit (not shown), reference voltages, or the like. All, or substantially all (at least, for example, 95%), of the I/O pads 223 may be positioned in the outermost row 221 of pads 220. Although not required, the I/O pads 223 may be paired to carry a single high-frequency signal, as known in the art, so that one I/O pad 223 carries an inverted version of the signal, and its paired I/O pad 223 carries the positive version of the signal; the signal itself may be inferred from the difference between the paired I/O pads 223. Power-related pads 225, and in particular ground pads 225, may be used to separate the paired I/O pads 223, and thus further dampen crosstalk between the paired I/O pads 223. Pads 226 used for other circuit functions are positioned into the innermost row 222 of pads 220, and optionally into the outermost row 221 of pads 220 if space and design rules on the circuit die 210 permits.

The substrate 201 upon which the circuit die 210 is positioned comprises a plurality of wedges 240, arranged into three rows 241, 242, 243. Innermost row wedges 241 are preferably used to carry the high-frequency signals from or to the I/O pads 223, and are disposed closest to the circuit die 210. The innermost row of wedges 241 may also carry, for example, ground or power, if space permits. To avoid shorting with the fillet (not shown), these innermost wedges 241 are typically at least 400 μm from the edge of the circuit die 210, although the wedges 241 may be disposed closer to the die 210 if the fillet is non-conductive. Of all wedges 240 electrically connected to the circuit die 210, fewer than 10%, and in preferred embodiments none, of the wedges 240 used for functions other than high-frequency I/O are disposed substantially closer to the circuit die 210 than those wedges 240 that are used to carry the high-frequency I/O signals, i.e., the innermost row wedges 241. Similarly, at least about 50%, and preferably at least 95%, or more preferably still all, of the wedges carrying high-frequency I/O are the substantially closest wedges 240 to the circuit die 210; that is, the innermost row 241 of wedges 240. Outermost row 243 wedges 240 may be used to connect to pads 220 that are not related to high-frequency I/O. Middle row 242 of wedges 240 may be used for both high-frequency I/O and other circuit functions. For example, in certain specific embodiments, the middle row wedges 242 may be about 1800 μm from the circuit die 210, and the outermost row wedges 243 may be about 2800 μm from the circuit die 21. In these embodiments, then, a substantial difference in the distance of the wedges 240 from the circuit die 210 may be about 800 μm. By way of further example, the middle row wedges 242 may be used to connect to the power-related pads 225 in the outermost row pads 221, while the outermost row wedges 243 may be used to connect to the innermost row pads 222. Lowest tiered bond wire 231 is preferably used to electrically connect the innermost row wedges 241 to the high-frequency I/O pads 223 in the outermost row pads 221. Middle tier bond wire 232 connects the middle row wedges 242 to the outermost row pads 221, which may be, for example, power-related connections or high-frequency I/O connections. Finally, highest tiered bond wire 233 connects the innermost row pads 222 to the outermost row wedges 243. Although there may be some minor variations in lengths between the lowest tiered bond wires 231, these lowest tiered bond wires 231 are generally all substantially shorter than any of the middle tiered bond wires 232, or highest tiered bond wire 233. For example, the lowest tier bond wires 231 along a radial direction may all be about 800 μm shorter than the middle tier bond wires 232 along the same general radial direction.

In certain preferred embodiments, pads 223 carrying high-frequency I/O are positioned within their respective rows so that within each row, no pad 223 has bond wires 230 that are more than 25% longer than the bond wires 230 of the other high-frequency I/O pads 223 within that row. Hence, in some embodiments, the high-frequency I/O pads 123 are preferentially disposed away from the corner positions of the die 210 and more towards the central regions of the edges of the die 210. In certain particularly advantageous configurations, all of the pads 223 carrying high-frequency I/O signals are centrally located in the outermost row 221; that is, preferentially disposed away from the corner positions. Their corresponding wedges 240 are disposed within the innermost row 241 along the same general radial direction. Hence, the shortest possible, lowest tiered bond wire 231 is used to carry all of the high-frequency I/O signals, and no other bond wire 230 used for other circuit functions is substantially shorter than any of the bond wires 230 used to carry the high-frequency I/O signals.

By positioning all, or substantially all (such as 95%), of the high-frequency I/O pads 223 into the outermost row 221 of pads 220, and positioning a majority of the corresponding high-frequency I/O wedges 140 into the innermost row 241, all or substantially all of the high-frequency I/O signals are carried by the lowest tiered bond wire possible. Relatively few, if any, of the bond wires 230 used for purposes other than high-frequency I/O will have lengths substantially shorter than at least the shortest 50% used for high-frequency I/O.

It is believed that routing all, or substantially all (such as 95%) of the high-frequency signals through the substantially shortest bond wires 131 leads to reduced signal crosstalk between the high-frequency bond wires 131. FIG. 9 provides a graph of crosstalk as a function of operating frequency for a simulated circuit device packaged according to the instant invention methods and flip-chip. For most applications, it is desired that signal crosstalk be less than −45 dB. As shown, wire bond packaging may be employed at least up to 6 GHz under the instant invention. Moreover, if customer design specifications are tolerant enough (such as accepting −40 dB of crosstalk, or less), wire bond packaging may be used across the full frequency range supported by flip-chip. The reductions in crosstalk provided by the instant invention can be so substantial that operating frequencies in the range of 6 GHz may be possible for wire bond packaging, which was previously considered the exclusive domain of more expensive flip-chip packaging methods; indeed, as shown by the graph in FIG. 9, operating frequencies of up to 12 GHz may be possible. As a result, substantial savings in packaging costs can be achieved.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the following claims.

What is claimed is:

1. A method for routing high-frequency signals between a circuit die and a packaging substrate, the circuit die comprising a plurality of pads arranged in a plurality of rows and used to electrically connect the circuit die to the packaging substrate, the circuit die using a total of N of the pads for high-frequency input/output (I/O) and M of the pads for other circuit functions, the method comprising configuring the pads and corresponding substrate wedges so that no more than X of the M pads for other circuit functions are electrically connected to substrate wedges through bond wires that are substantially shorter than the Y shortest bond wires used to electrically connect the N high-frequency I/O pads to corresponding substrate wedges, wherein X is no greater than 10% of N+M and Y is at least 50% of N.

2. The method of claim 1 wherein the X pads are electrically connected to ground or power.

3. The method of claim 1 wherein X is zero and Y equals N.

4. The method of claim 3 wherein the circuit die comprises a total of M+N pads.

5. The method of claim 1 wherein at least Y of the high-frequency I/O pads are disposed along an outermost circumference of the plurality of rows.

6. The method of claim 5 wherein at least Y of the high-frequency I/O pads are connected to corresponding substrate wedges through lowest-tiered bond wires.

7. The method of claim 6 wherein no more than X substrate wedges electrically connected to any of the M pads for other circuit functions are disposed substantially closer to the circuit die than any substrate wedge electrically connected to any of the N high-frequency I/O pads through the Y shortest bond wires that carry high-frequency I/O signals.

8. The method of claim 7 wherein X is zero and Y equals N.

9. The method of claim 5 wherein no more than X substrate wedges electrically connected to any of the M pads for other circuit functions is disposed substantially closer to the circuit die than any substrate wedge electrically connected to any of the N high-frequency I/O pads through the Y shortest bond wires that carry high-frequency I/O signals.

10. The method of claim 9 wherein X is zero and Y equals N.

11. The method of claim 1 wherein the N high-frequency I/O pads carry signals of at least 2 GHz.

12. The method of claim 1 wherein the Y shortest bond wires electrically connected to the N high-frequency I/O pads have respective lengths that are no longer than 2.5 mm.

13. An electronic device comprising:
a packaging substrate comprising a plurality of wedges electrically connected to external conductors of the packaging substrate;
a circuit die disposed on the packaging substrate, the circuit die comprising a plurality of pads arranged in a plurality of rows, a total of N of the pads being used for high-frequency input/output (I/O) and M of the pads for other purposes; and
a plurality of bond wires electrically connecting the pads to the wedges;
wherein no more than X of the M pads for other purposes are electrically connected to corresponding wedges through bond wires that are substantially shorter than the Y shortest bond wires used to electrically connect the N high-frequency I/O pads to corresponding wedges, wherein X is no greater than 10% of N+M and Y is at least 50% of N.

14. The electronic device of claim 13 wherein X is zero and Y equals N.

15. The electronic device of claim 14 wherein the circuit die comprises a total of N+M pads.

16. The electronic device of claim 13 wherein the X pads are electrically connected to ground or power.

17. The electronic device of claim 13 wherein at least Y of the N high-frequency I/O pads are disposed along an outermost circumference of the plurality of rows.

18. The electronic device of claim 17 wherein the bond wires connecting at least Y of the high-frequency I/O pads to the corresponding substrate wedges are lowest-tiered bond wires.

19. The electronic device of claim 18 wherein no more than X substrate wedges electrically connected to any of the M pads for other purposes are disposed substantially closer to the circuit die than any of the substrate wedges electrically connected to the N high-frequency I/O pads.

20. The electronic device of claim 19 wherein X is zero.

21. The electronic device of claim 17 wherein no more than X substrate wedges electrically connected to any of the M pads for other circuit functions are disposed substantially closer to the circuit die than any substrate wedge electrically connected to any of the N high-frequency I/O pads through the Y shortest bond wires.

22. The electronic device of claim 21 wherein X is zero.

23. The electronic device of claim 13 wherein the N high-frequency I/O pads carry signals of at least 2 GHz.

24. A method for routing high-frequency signals between a circuit die and a packaging substrate, the circuit die comprising a plurality of pads, some of the pads being used for high-frequency input/output (I/O) and some of the pads being used for other circuit functions, the pads arranged in a plurality of rows, the method comprising:
disposing substantially all of the pads used for high-frequency I/O into an outermost row of the rows of pads; and
utilizing wire bonds to electrically and physically connect the pads used for high-frequency I/O to corresponding wedges on the substrate.

25. The method of claim 24 further comprising positioning substantially all of the wedges that are electrically and physically coupled to the pads used for high-frequency I/O into an innermost row of wedges on the substrate.

26. The method of claim 24 wherein at least 95% of the pads used for high-frequency I/O are disposed into the outermost row of pads.

27. The method of claim 26 wherein the respective bond wires of the at least 95% of the pads used for high-frequency I/O disposed into the outermost row of pads have lengths that differ from each other by no more than 25%.

28. The method of claim 24 wherein the pads used for high-frequency I/O carry signals of at least 2 GHz.

29. An electronic device formed according to the method of claim 24.

* * * * *